(12) United States Patent
Takahashi

(10) Patent No.: US 7,476,972 B2
(45) Date of Patent: Jan. 13, 2009

(54) CIRCUIT DEVICE, MANUFACTURING METHOD THEREOF, AND SHEET-LIKE BOARD MEMBER

(75) Inventor: Kouji Takahashi, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 430 days.

(21) Appl. No.: 11/131,638

(22) Filed: May 17, 2005

(65) Prior Publication Data

US 2005/0260796 A1      Nov. 24, 2005

(30) Foreign Application Priority Data

May 20, 2004    (JP) .............................. 2004-150362

(51) Int. Cl.
*H01L 29/40* (2006.01)
(52) U.S. Cl. ...................................... 257/773; 257/779
(58) Field of Classification Search ................ 257/773, 257/780, 758, E23.141
See application file for complete search history.

(56) References Cited

U.S. PATENT DOCUMENTS

| | | | |
|---|---|---|---|
| 6,706,547 B2 | 3/2004 | Sakamoto et al. | |
| 6,975,022 B2 | 12/2005 | Sakamoto et al. | |
| 7,220,921 B1 | 5/2007 | Sakamoto et al. | |
| 2007/0163992 A1* | 7/2007 | Michalk et al. | ............... 216/41 |

FOREIGN PATENT DOCUMENTS

| | | |
|---|---|---|
| JP | 2001-250884 | 9/2001 |
| JP | 2002-076246 | 3/2002 |

\* cited by examiner

*Primary Examiner*—Bradley K Smith
(74) *Attorney, Agent, or Firm*—Fish & Richardson P.C.

(57) ABSTRACT

Provided is a method of manufacturing a circuit device capable of forming a thick conductive pattern while reducing a degree of side etching. In the manufacturing method for a circuit device, a first isolation trench is provided on a surface of a conductive foil, and conductive patterns are formed in convex shaped. Moreover, second isolation trenches are provided on a rear surface of the conductive foil in regions corresponding to positions where the first isolation trenches are formed. Then, resin sealing is performed after completing fixation and electrical connection of a circuit element. Thereafter, the respective conductive patterns are isolated by etching the rear surface of the conductive foil.

6 Claims, 13 Drawing Sheets

CIRCUIT DEVICE, MANUFACTURING METHOD THEREOF, AND SHEET-LIKE BOARD MEMBER

BACKGROUND OF THE INVENTION

Priority is claimed to Japanese Patent Application Number JP2004-150362 filed on May 20, 2004, the disclosure of which is incorporated herein by reference in its entirety.

1. Field of the Invention

The present invention relates to a circuit device, a manufacturing method thereof, and a sheet-like board member. More specifically, the present invention relates to a circuit device having a conductive pattern isolated by isolation trenches, a manufacturing method thereof, and a sheet-like board member.

2. Related art

Conventionally, circuit devices to be set on electronic devices are expected to satisfy demands for smaller sizes, thinner profiles, and lighter weights for application to mobile telephones, portable computers, and the like.

For example, a wafer scale chip size package (referred to as CSP) having a size equivalent to a chip has been recently released.

FIG. 12 shows CSP 66 having a slightly larger size than a chip size, which adopts glass epoxy substrate 65 as a supporting substrate. Description will be made herein on an assumption that a transistor chip T is mounted on the glass epoxy substrate 65.

First electrode 67, second electrode 68, and die pad 69 are formed on a surface of this glass epoxy substrate 65, and first rear surface electrode 70 and second rear surface electrode 71 are formed on a rear surface thereof. Moreover, the first electrode 67 is electrically connected to the first rear surface electrode 70 via a through hole TH and the second electrode 68 is electrically connected to the second rear surface electrode 71 via another through hole TH. Meanwhile, the bare transistor chip T is fixed to the die pad 69, an emitter electrode of the transistor is connected to the first electrode 67 through metal thin wire 72, and a base electrode of the transistor is electrically connected to the second electrode 68 through the metal thin wire 72. In addition, the glass epoxy substrate 65 is provided with resin layer 73 so as to cover the transistor chip T.

Although the CSP 66 adopts the glass epoxy substrate 65, the CSP 66 has a simple extension structure from the chip T to the rear surface electrodes 70 and 71 for external connection in contrast to a wafer scale CSP. Accordingly, the CSP 66 has an advantage of productivity at lower costs.

However, the CSP 66 uses the glass epoxy substrate 65 as an interposer. Accordingly, the CSP 66 has limitations for achieving a smaller size and a thinner profile. For this reason, circuit device 80 which does not require an interposer has been developed. This technology is described for instance in Japanese Patent Publication No. 2002-076246 (p. 7, FIG. 1).

Referring to FIG. 13A, the circuit device 80 includes conductive pattern 81, circuit element 82 fixed onto the conductive pattern 81, metal thin wire 84 for electrically connecting the circuit element 82 to the conductive pattern 81, and sealing resin 83 for covering the circuit element 82 and the conductive pattern 81 while exposing a rear surface of the conductive pattern 81. Therefore, the circuit device 80 does not require a mounting substrate, and is formed in a thinner profile and a smaller size as compared to the CSP 66. Moreover, the above-described circuit device 80 is formed by providing isolation trenches 87 on a surface of a sheet of a conductive foil, performing fixation of the circuit element 82 and formation of the sealing resin 83, and then etching back the conductive foil until the sealing resin 83 filled in the isolation trenches 87 are exposed.

FIG. 13B shows an example of the etch-back step carried out as an experiment. Specifically, respective conductive patterns 81 are formed by etching after forming resist 90 on a rear surface of the conductive foil so as to cover regions targeted for forming the conductive patterns 81. Side surfaces of the conductive patterns 81 formed in the above-described steps have curved shapes.

In the above-described method of forming the circuit device 80, the respective conductive patterns 81 are electrically isolated from one another by use of the isolation trenches 87. But this method causes problems as described below.

Referring to FIG. 13B, side etching progresses on an interface of the resist 90, and thus an area of a rear surface of the electrode that remains after isolation becomes extremely small. Moreover, when solder resist covers the rear surface and points of solder mounting are opened, it is not possible to perform solder mounting at flat portions.

Meanwhile, due to an uneven progress of etching, the conductive foil may remain at portions of the isolation trenches 87. In such a case, the conductive patterns 81 may be electrically short circuited.

Furthermore, over-etching may be often performed to suppress the above-described problems, and the individual conductive patterns 81 may become excessively thin.

SUMMARY OF THE INVENTION

The present invention provides a method of manufacturing a circuit device, a circuit device, and a sheet-like board member, which are capable of forming a thick conductive pattern while reducing a degree of side etching.

The present invention provides a method of manufacturing a circuit device, which includes preparing a conductive foil, forming a conductive pattern protruding in a convex shape by forming a first isolation trench on a surface of the conductive foil, providing a second isolation trench on a rear surface of the conductive foil in a position corresponding to the first isolation trench, electrically connecting a circuit element to the conductive pattern, forming sealing resin so as to be filled in the first isolation trench and to cover the circuit element, and removing the rear surface of the conductive foil until the sealing resin filled in the first isolation trench is exposed.

The present invention also provides a method of manufacturing a circuit device, which includes the steps of preparing a conductive foil in which a conductive pattern protruding in a convex shape is formed on a front surface thereof by use of a first isolation trench and a second isolation trench is provided on a rear surface of the conductive foil in a position corresponding to the first isolation trench, electrically connecting a circuit element to the conductive pattern, forming sealing resin so as to be filled in the first isolation trench and to cover the circuit element, and removing the rear surface of the conductive foil until the sealing resin filled in the first isolation trench is exposed.

Moreover, in the methods of manufacturing a circuit device according to the present invention, the first isolation trench and the second isolation trench are formed simultaneously by wet etching.

Moreover, in the methods of manufacturing a circuit device according to the present invention, a through hole is provided in a thickness direction of the conductive foil, and the first isolation trench, the second isolation trench, and the through hole are formed simultaneously by wet etching.

Moreover, in the methods of manufacturing a circuit device according to the present invention, removal of the rear surface of the conductive foil is performed by wet etching through an etching mask selectively covering the rear surface of the conductive foil so as to expose the second isolation trench.

Moreover, in the methods of manufacturing a circuit device according to the present invention, the insulative region filled in the first isolation trench is exposed by etching the rear surface of the conductive foil entirely.

Moreover, in the method of manufacturing a circuit device according to the present invention, a unit constituting one circuit device is provided by use of the multiple conductive patterns, while the multiple units are formed on the surface of the conductive foil, and the multiple second isolation trenches are provided on the rear surface of the conductive foil in regions corresponding to the first isolation trenches provided between the units.

Moreover, in the methods of manufacturing a circuit device according to the present invention, the surface of the conductive foil inclusive of the first isolation trench is covered with covering resin, and the conductive pattern partially exposed out of the covering resin is electrically connected to the circuit element.

The present invention provides a circuit device having multiple conductive patterns at least constituting an island and a pad provided adjacently to the island, a circuit element mounted on the island and electrically connected to the pad, and insulative resin for sealing the circuit element and the conductive patterns while exposing rear surfaces of the conductive patterns, in which the insulative resin protrudes out of an isolation trench for isolating the conductive patterns, and a corner portion defined by connecting the rear surface of the conductive pattern to a side surface thereof is formed smoothly.

Moreover, the circuit device according to the present invention includes a wiring portion formed of the conductive patterns, and the wiring portion includes electrically connecting regions in different positions in terms of a plane thereof.

Moreover, the circuit device according to the present invention incorporates the multiple circuit elements to be electrically connected by the wiring portion formed of the conductive patterns.

Moreover, in the circuit device according to the present invention, a rear surface of the insulative resin for allowing exposure of the conductive patterns is covered with resist, and plane surfaces of the conductive patterns are exposed out of open portions provided on the resist.

The present invention provides a sheet-like board member which includes a conductive pattern protruding in a convex shape by use of a first isolation trench formed by half-etching, which is formed on a first main surface, and a second isolation trench formed on a second main surface in a region corresponding to the first isolation trench.

Moreover, in the sheet-like board member according to the present invention, a unit constituting a circuit device is formed by use of the multiple conductive patterns, and the multiple units are arranged in a matrix on the first main surface.

Moreover, in the sheet-like board member according to the present invention, a block formed of the multiple units is formed on the first main surface, and an alignment mark formed in a convex shape by use of the first isolation trenches is formed inside the block.

Moreover, in the sheet-like board member according to the present invention, the second isolation trench is shallower than the first isolation trench.

Moreover, in the sheet-like board member according to the present invention, the first isolation trenches are formed substantially in the same width.

Moreover, in the sheet-like board member according to the present invention, the first isolation trench adjacent to the conductive pattern expected to fix a power system element thereto is formed wider than the rest of the first isolation trenches.

According to the methods of manufacturing circuit device of the present invention, it is possible to ensure electric isolation among the respective conductive patterns by providing the second isolation trenches on the rear surface of the conductive foil. Moreover, by allowing a progress of etching preferentially in the thickness direction of the conductive foil corresponding to the isolation trenches, it is possible to form the respective conductive patterns thickly on both sides of each of the isolation trenches, and thereby to enhance a thermal characteristic of the entire circuit device. Furthermore, since the second isolation trench can be formed simultaneously in the step of forming the first isolation trench, it is possible to realize the present invention while suppressing an increase in the number of the steps. In addition, it is possible to ensure an area of the rear surface of each of the electrodes and to ensure a solder mounting portion.

Moreover, according to the circuit device of the present invention, the corner portion located in the vicinity of the convex portion is rounded upon an etch-back process as shown in FIG. 8A. For this reason, it is possible to substantially uniform a thickness of an insulative coating to be coated on the rear surface inclusive of the corner portion. In addition, since the corner portion on the rear surface of conductive pattern 11 is formed into the round shape, there is an advantage of facilitating formation of the resist for covering the conductive pattern 11.

DESCRIPTION OF THE PREFERRED EMBODIMENTS

First Embodiment

Figure 1A:
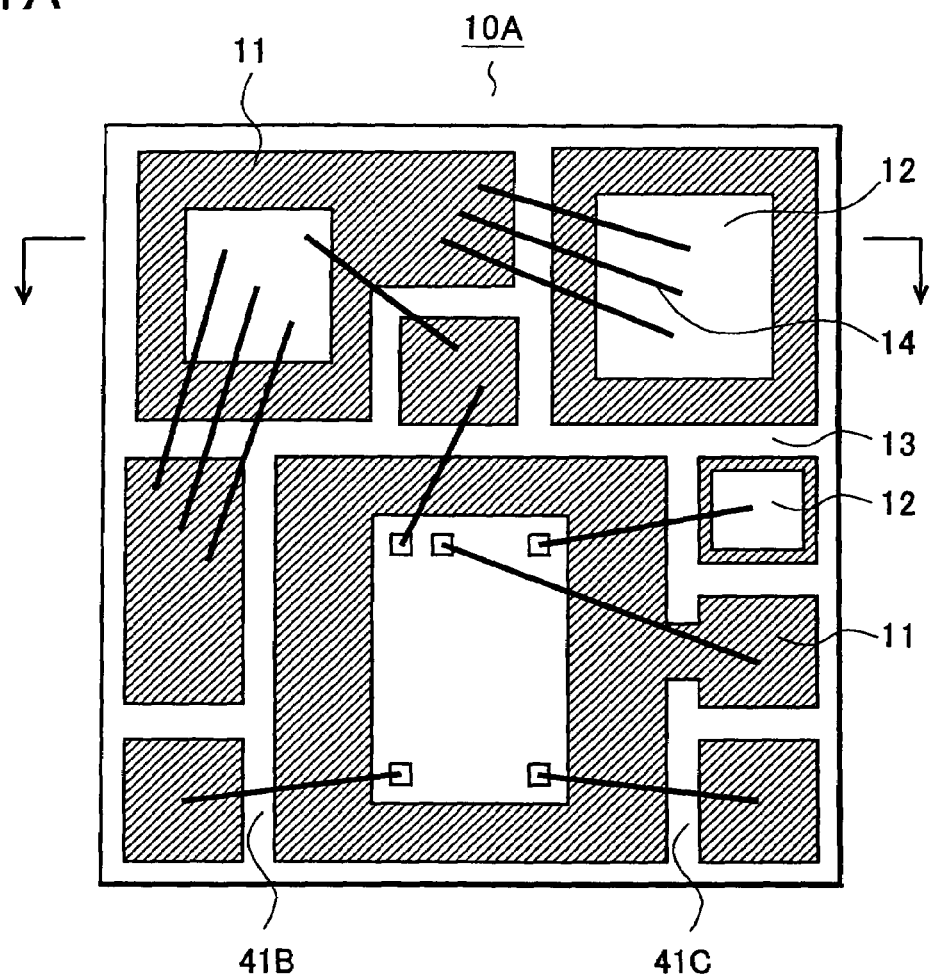
FIG. 1A is a plan view and FIG. 1B is a cross-sectional view showing a circuit device according to an embodiment of the present invention.
Figure 1B:
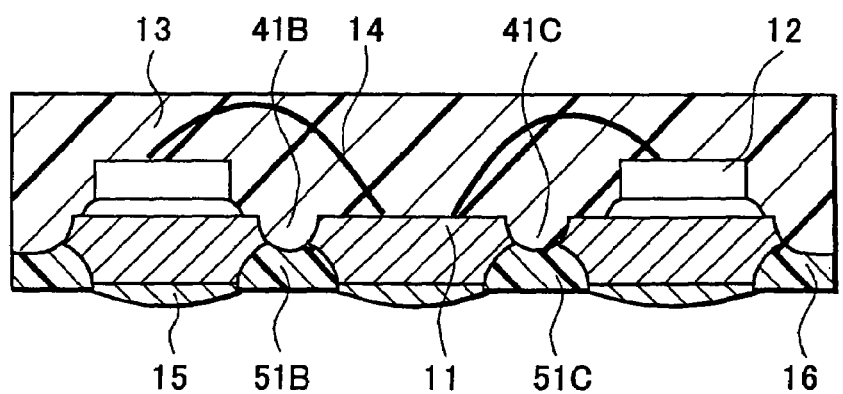

An example of a circuit device of the present invention will be described in this embodiment. A configuration of circuit device 10A of this embodiment will be described with reference to FIGS. 1A and 1B. FIG. 1A is a plan view of the circuit device 10A, and FIG. 1B is a cross-sectional view thereof.

Referring to FIG. 1A, the circuit device 10A of this embodiment includes conductive patterns 11, circuit elements 12 electrically connected to the conductive patterns 11, and sealing resin 13 covering the circuit elements 12 and the conductive patterns 11 while exposing rear surfaces of the conductive patterns 11. Now, the respective constituents will be described below.

The material of the conductive pattern 11 is appropriately selected in consideration of an adhesion property to a brazing member, a bonding property, and a plating property. To be more precise, a conductive foil containing Cu as a main ingredient, a conductive foil containing Al as a main ingredient, a conductive foil made of an alloy such as Fe—Ni, and the like are adopted as the material of the conductive pattern 11. Here, the conductive pattern 11 has a structure buried in the sealing resin 13 while exposing a rear surface thereof, and is electrically isolated by the sealing resin filled in first isolation trenches 41. Meanwhile, external electrode 15 made of a brazing member such as solder is provided on the rear surface of each of the conductive patterns 11 exposed out of the sealing resin 13. The conductive patterns 11 are formed by etching, and side surfaces thereof are formed into curved planes. Moreover, portions on a rear surface of the device where it is impossible to provide the external electrodes 15 are covered with resist 16.

In the drawings, the resist 16 is buried only in the isolation trenches to expose plane portions on the rear surfaces of the conductive patterns. However, when the conductive patterns are larger, it is possible to cover the rear surfaces so as to partially expose the plane portions. Meanwhile, unlike the conventional example shown in FIG. 13A, the resist is formed on the rear surfaces so as to be buried in second isolation trenches. Accordingly, adhesion of the resist 16 is enhanced in terms of the rear surface of the circuit device.

As the circuit element 12, it is possible to adopt a semiconductor element such as a transistor, a diode or an IC chip, and a passive element such as a chip capacitor or a chip resistor. In addition, it is also possible to mount a CSP or a BGA although such an element causes an increase in thickness. Here, the circuit element 12 mounted in a face-up fashion is electrically connected to other conductive patterns 11 through metal thin wires 14.

The sealing resin 13 covers the circuit elements 12, the metal thin wires 14, and the conductive patterns 11 while exposing the rear surfaces of the conductive patterns 11. It is possible to adopt thermosetting resin or thermoplastic resin as the sealing resin 13. Moreover, the sealing resin 13 is filled in the first isolation trenches 41 for isolating the respective conductive patterns 11. In addition, the entire circuit device 10 of the present invention is supported by the sealing resin 13.

The first conductive patterns 41 are provided between the respective conductive patterns 11, and have a function to electrically isolate the respective conductive patterns 11. Moreover, each of the isolation trenches 41 is basically formed into the same width in any position. In other words, the respective conductive patterns 11 are isolated at even intervals. Here, the "even intervals" stated herein mean the even intervals including unevenness caused in manufacturing processes. Accordingly, certain errors may occur in a strict sense.

In the circuit device 10A of this embodiment, the respective conductive patterns 11 are electrically isolated from one another by first isolation trenches 41B and 41C formed on the surface and by second isolation trenches 51B and 51C formed on the rear surface. Accordingly, it is possible to form the thick conductive patterns 11 in the thickness equal to or above 100 μm, for example, and thereby to enhance a radiation effect.

Figure 13A:
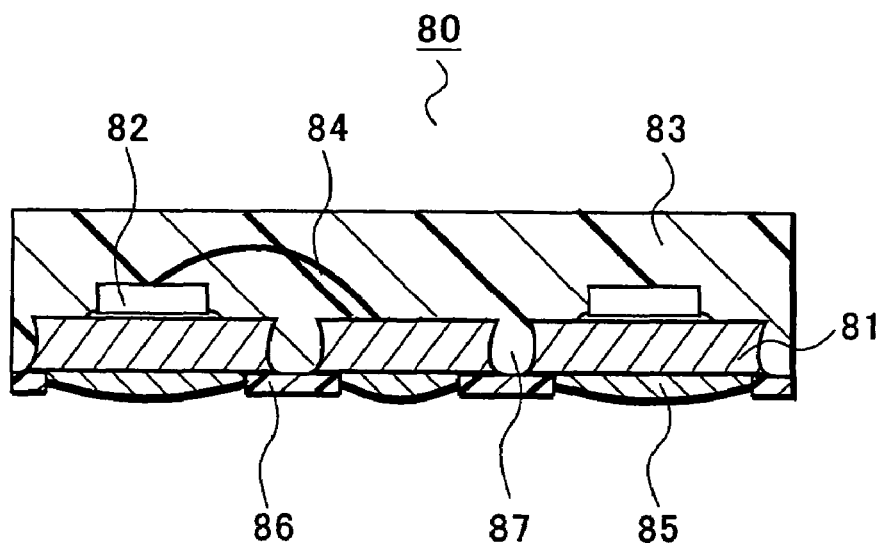
FIGS. 13A and 13B are cross-sectional views showing the conventional circuit device.
Figure 13B:
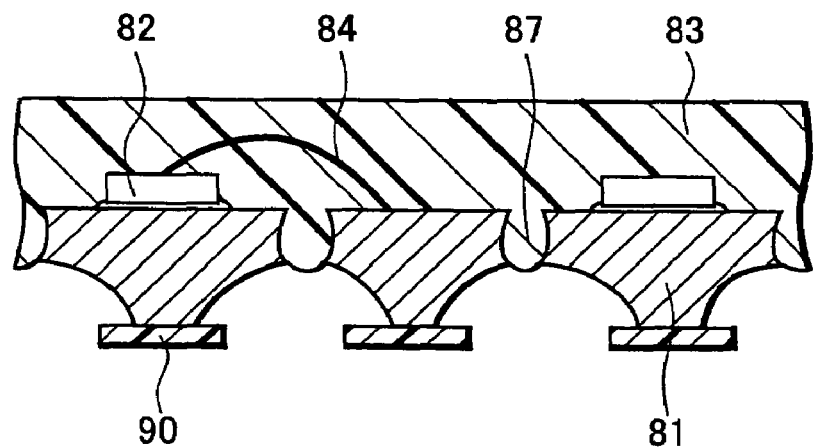

Conventionally, it was difficult to form the thick conductive patterns due to reasons in terms of manufacturing processes. To be more precise, as shown in FIG. 13A, the respective conductive patterns 81 are isolated from one another by etching the conductive foil until the sealing resin 83 filled in the isolation trenches 87 are exposed. However, over-etching was performed in order to ensure the isolation. Accordingly, the conductive patterns 81 are formed into thin profiles around several tens of micrometers.

Figure 2:
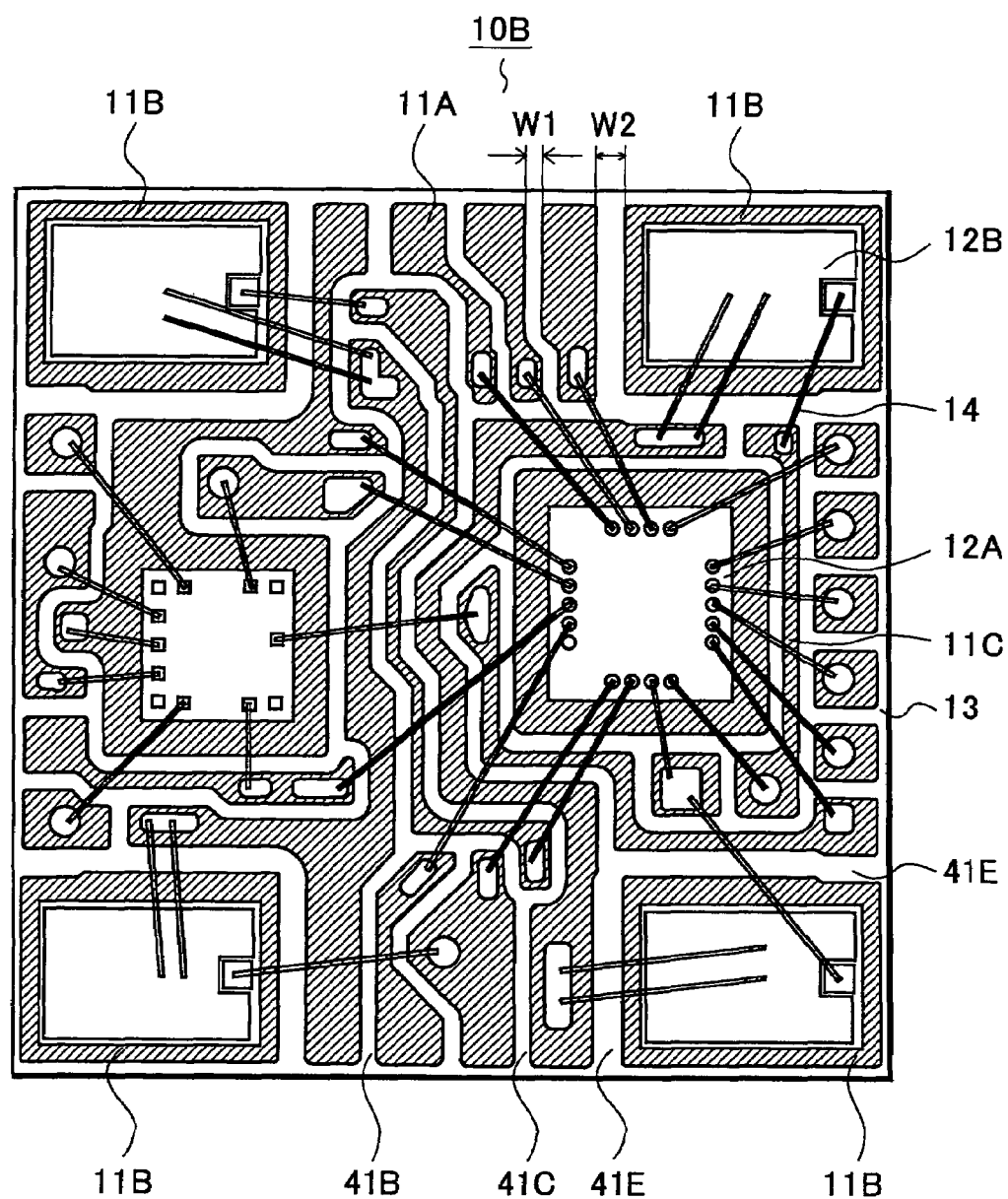
FIG. 2 is a plan view showing another circuit device according to the present invention.

A configuration of a circuit device 10B of a different configuration will be described with reference to FIG. 2. FIG. 2 is a plan view of the circuit device 10B. In the circuit device 10B shown in this drawing, a wiring portion is formed by use of the conductive patterns 11. Moreover, distances between the conductive patterns may be locally different. The basic configuration of the circuit device 10B is similar to the circuit device 10A shown in FIGS. 1A and 1B.

The circuit device 10B incorporates two types of circuit elements 12, namely, circuit element 12A which is an IC chip, and circuit element 12B which is a semiconductor element configured to switch a large current equal to or above several amperes. The circuit element 12B is the semiconductor element configured to perform switching based on a control signal supplied from the circuit element 12A. In addition to these semiconductor elements, other circuit elements such as a chip resistor or a chip capacitor may be incorporated in the circuit device 10B.

Wiring portion 11C is the conductive pattern 11 in which electrically connecting regions are formed in different positions in terms of a plane thereof. For example, in the wiring portion 11C, one end is connected to the circuit element 12A which is the IC through the metal thin wire 14. Moreover, the other end of the wiring portion 11C is connected to the circuit element 12B which is a switching element through the metal thin wire 14. Therefore, the wiring portion 11C functions as part of a path for connecting the elements incorporated in the circuit device 10B. Meanwhile, the wiring portion 11C extends below the metal thin wires 14. The multiple wiring portions 11C are formed in the circuit device 10B, and distances of isolation among the wiring portions 11C are substantially equal in positions where the wiring portions 11C are adjacent to one another.

In the circuit device 10A described with reference to FIGS. 1A and 1B, the distances of isolation among the conductive patterns 11 incorporated therein were substantially equal. On the contrary, the relevant distances vary in the circuit device 10B shown in FIG. 2. To be more precise, a distance of isolation between conductive pattern 11B of a land shape where the circuit element 12B being the switching element is disposed and another conductive pattern 11 is set longer than the distances in other positions. Here, the other conductive pattern 11 includes the conductive pattern 11 constituting the wiring portion 11C, and the conductive pattern 11 of a land shape where the circuit element 12A being the control IC is placed. For example, a distance (W1) of isolation between the other conductive patterns 11 is set to about 150 μm. On the contrary, a distance (W2) of isolation between the conductive pattern 11B and the other pattern 11 is set to about 250 μm.

The reason for providing the conductive pattern 11B with the longer distance of isolation from the other conductive pattern 11 is to ensure withstand voltage of the conductive pattern 11B. The circuit element 12B configured to perform switching of a large current (about 2 A at 250 V, for example) is fixed to the conductive pattern 11B through an adhesive such as solder. Therefore, when the circuit element 12B is in operation, the above-mentioned large current also flows on the conductive pattern 11B. In contrast, a small electric control signal (about several tens of milliamperes at several volts, for example) passes through another conductive pattern 11A. Accordingly, there is a large potential difference between the conductive pattern 11B and the conductive pattern 11A. Therefore, it is important to isolate both patterns sufficiently to ensure the withstand voltage. Moreover, it is also possible to prevent the large current that passes through the conductive pattern 11B from generating noises on the control signal passing through the conductive pattern 11A.

To sum up, when the widths of the isolation trenches 41 formed by etching are set substantially uniform, it is possible to uniform depths of the first isolation trenches. Therefore, it is possible to achieve favorable isolation of the respective conductive patterns 11 by etching which is started from the rear side. However, in the case of the conductive pattern 11 configured to allow the large current to pass through, it is necessary to isolate the conductive pattern 11 at a given distance or above so as to ensure the withstand voltage relative to the other conductive patterns 11. Therefore, the width of the certain isolation trench 41 may be set wider in light of ensuring the withstand voltage. Such a width is represented as the width W2 in FIG. 2.

Two types of patterns using the conductive foil have been described above. However, the embodiment of the present invention also allows other patterns, which are as follows.

1: A pattern including a bonding pad, which is electrically connected to a discrete type circuit element, for example, and is disposed around a land that the circuit element is fixed to. In particular, this pattern is applied to a circuit element, which incorporates either an IC having a small number of terminals or a discrete transistor.

2: A pattern which is electrically connected to a circuit element (such as an IC) having a large number of pins and is drawn around a land for disposing the circuit element for the purpose of rewiring. This pattern continuously extends from a pad which is electrically connected to the circuit element.

3: A system in package (SIP) incorporating any of a transistor, an IC, a passive element, and an assembly thereof. These elements are electrically connected through the above-described wiring portion 11C. As for the shape of this wiring portion 11C, in addition to the extended elongate shape as shown in FIG. 2, it is also possible to adopt the conductive pattern 11 formed into an L-shape as the wiring portion 11C.

Second Embodiment

A method of manufacturing a circuit device 10 will be described with reference to FIG. 3A to FIG. 9.

As shown in FIG. 3A to FIG. 4C, a first step in this embodiment is to prepare conductive foil 40 and to form conductive patterns 11 protruding in convex shapes by forming the first and second isolation trenches.

Figure 3A:
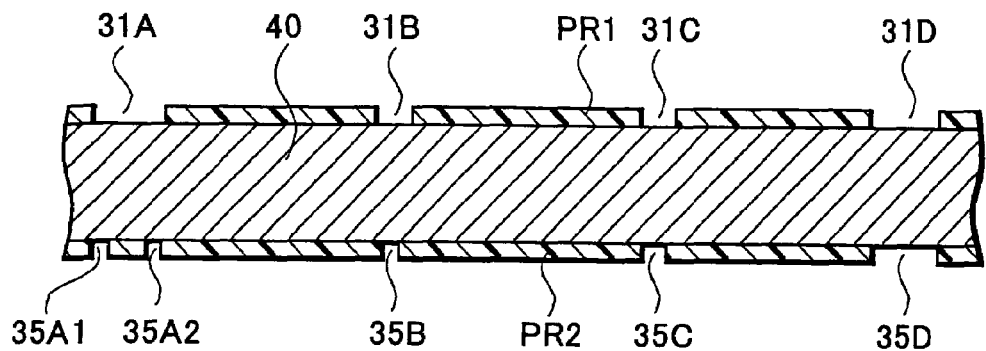
FIGS. 3A and 3B are cross-sectional views and FIG. 3C is a plan view showing a method of manufacturing a circuit device according to the embodiment of the present invention.

In this step, the conductive foil 40 of a sheet shape is firstly prepared as shown in FIG. 3A. The material of this conductive foil 40 is appropriately selected in consideration of an adhesion property to a brazing member, a bonding property, and a plating property. For example, a conductive foil containing Cu as a main ingredient, a conductive foil containing Al as a main ingredient, a conductive foil made of an alloy such as Fe—Ni, and the like are adopted as the material of the conductive foil 40. The thickness of the conductive film may be set in a range from about 10 μm to 300 μm in consideration of an etching process to be performed later.

Moreover, first resist PR1 and second resist PR2 are formed on both main surfaces of the conductive foil 40, namely, the surface and the rear surface. In addition, open portions are formed on both of the resist members so as to expose the conductive foil in regions targeted for forming the isolation trenches. First open portions 31A to 31D are formed on the first resist PR1, while second open portions 35A to 35D are formed on the second resist PR2.

The first open portion 31A is the open portion formed on the main surface of the conductive foil 40 on which the conductive patterns are formed. The first open portion 31A is also the isolation trench formed to isolate units each of which constitutes one circuit device. To be more precise, the width of the open portion 31 is set to about 300 μm, for example.

The first open portions 31B and 31C are the open portions provided for forming the isolation trenches 41 to isolate the respective conductive patterns 11 in each of the units. The widths of these open portions are set to about 150 μm, for example.

The first open portion 31D is the open portion provided for forming a guide hole or the like, which is a hole penetrating the conductive foil 40. The shape of the first open portion 31D is a circle having the diameter of about 2 mm.

The second open portions 35 formed on the rear surface of the conductive foil 40 are the open portions provided on the second resist PR2 so as to expose the rear surface of the conductive foil 40 in regions corresponding to the above-described first open portions 31. The widths of the second open portions 35A to 35C are set in a range of about 20 μm to 30 μm, for example. The second open portion 35D formed on the right end of the drawing is the open portion for forming the above-described guide hole. Accordingly, the second open portion 35D is a circle having the diameter of about 2 mm. That is, the planar size of the second open portion 35D is equivalent to the size of the first open portion 31D.

Figure 3B:
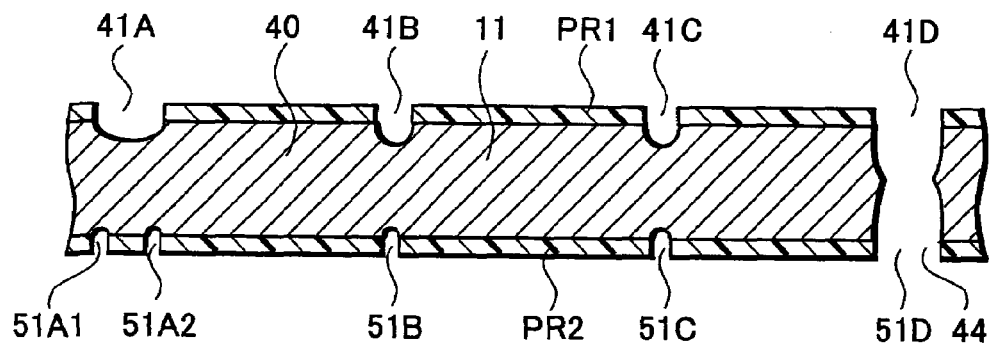

Referring to FIG. 3B, the isolation trenches are formed by etching the surface and the rear surface of the conductive foil 40 simultaneously. This etching process can be carried out by showering an etchant onto the conductive foil 40. In the following explanation, the isolation trenches formed on the surface of the conductive foil 40 will be referred to as the first isolation trenches, and the isolation trenches formed on the rear surface of the conductive foil 40 will be referred to as the second isolation trenches. Moreover, a cross-sectional shape of each of these isolation trenches has a curved shape, which brings an advantage of strengthening adhesion to the sealing resin in the subsequent step.

First isolation trench 41A is an isolation trench provided at a boundary between the units each of which constitutes one circuit device, and the width thereof is formed wider than other isolation trenches. To be more precise, concerning the size of the first isolation trench 41A, the width is set to 300 μm and the depth is set to about 60 μm, for example.

First isolation trenches 41B and 41C are isolation trenches provided for electrically isolating the respective conductive patterns 11 formed inside each of the units. Concerning the sizes of the first isolation trenches 41B and 41C, the widths are set to about 150 μm and the depths are set to about 60 μm, for example.

Second isolation trenches 51A1 and 51A2 are isolation trenches provided on the rear surface of the conductive foil 40 in regions corresponding to the above-described first isolation trench 41A. The widths of these second isolation trenches 51A1 and 51A2 are formed smaller than the widths of the isolation trenches formed on the surface of the conductive foil 40. To be more precise, the widths of the second isolation trenches 51A1 and 51A2 are set in a range from about 20 μm to 30 μm, for example, and the depths are set to about several micrometers.

Second isolation trenches 51B and 51C are isolation trenches provided on the rear surface of the conductive foil 40 in regions corresponding to the above-described first isolation trenches 41B and 41C. The sizes of these isolation trenches 51B and 51C may be equivalent to the sizes of the above-described second isolation trench 51A1 and the like.

Guide hole 44 penetrating the conductive foil 40 in the thickness direction is formed by use of first isolation trench 41D and second isolation trench 51D which are provided in the vicinity of the right end in the drawing. This guide hole 44 is used for positioning the conductive foil 40 in the following steps.

The etching process in this step is performed such that the guide hole 44 is pierced. Accordingly, in the case of widening the second isolation trenches 51, there is a risk of communication between the first isolation trench 41C and the second isolation trench 51C, for example. If the first isolation trench 41C is communicated with the second isolation trench 51C, there may be a problem of separation and breakup of the respective conductive patterns, a problem of leakage of sealing resin out of the communicated portion in a sealing process, and the like. For this reason, the second isolation trenches 51A1 to 51C are formed narrower than the second isolation trench 51D. Therefore, the second isolation trenches 51 should be shallower than the first isolation trenches 41.

Now, a relation between the width of the open portion 31 on the first resist PR1 and the depth of the isolation trench 41 to be formed in that place will be described. As the open portion 31 becomes wider, a flow rate of an etchant flowing on that portion becomes faster. Therefore, the isolation trench 41 formed in the wider open portion 31 becomes deeper. On the contrary, in the case of narrower open portion 31, the flow rate of the etchant is reduced. Accordingly, the reacted etchant will remain in that position and the progress of etching is thereby inhibited. Meanwhile, in the case of the open portion 31 formed in a certain width (such as 150 μm) or above, the depth of the isolation trench 41 becomes uniform.

Figure 3C:
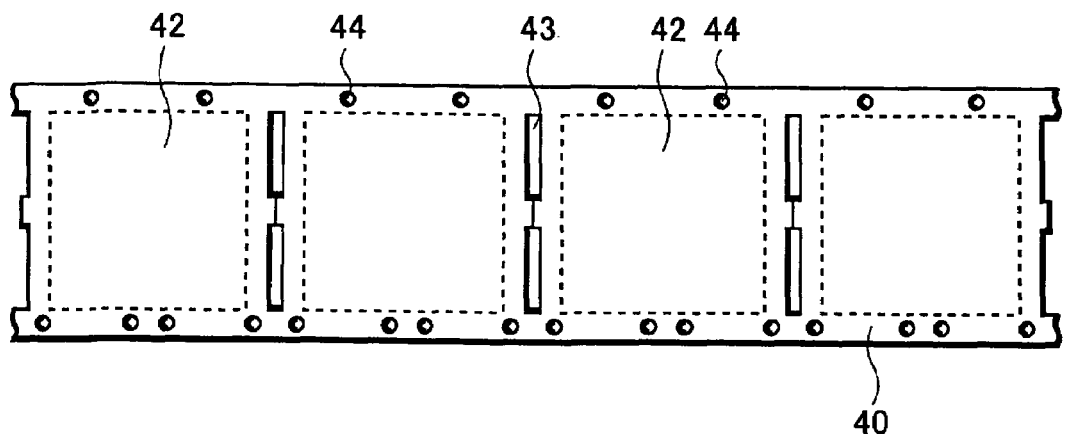

A planar configuration of the conductive foil 40 formed in the above-described etching process will be described with reference to FIG. 3C. Four to five blocks 42 are separately arranged on the conductive foil 40 of a strip shape, in which numerous units are formed in each of the blocks 42. Slits 43 are provided between the respective blocks 42, which are configured to absorb stress on the conductive foil 40 generated in the course of a heat treatment such as a molding process. Moreover, the guide holes 44 are provided at constant intervals on upper and lower peripheral ends of the conductive foil 40, which are used for positioning in the respective steps. In this step, the guide holes 44 and the slits 43 described above are also formed at the same time in addition to the isolation trenches for constituting the conductive patterns 11.

Figure 4A:
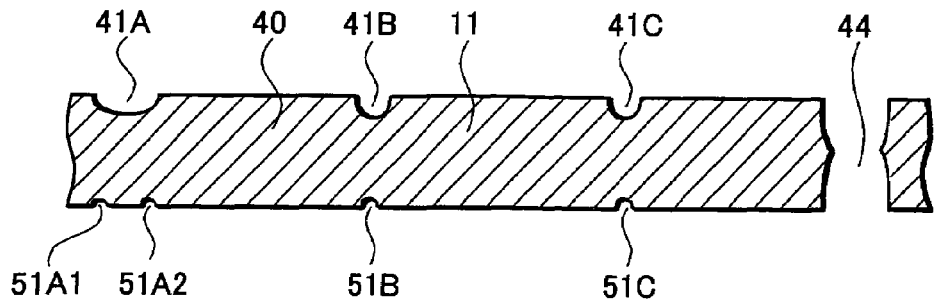
FIG. 4A is a cross-sectional view and FIGS. 4B and 4C are plan views showing the method of manufacturing a circuit device according to the embodiment of the present invention.
Figure 4B:
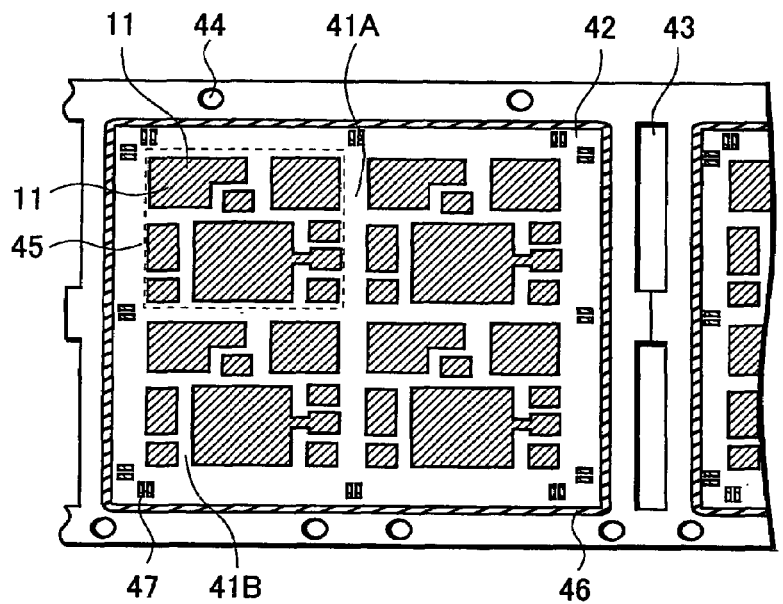
Figure 4C:
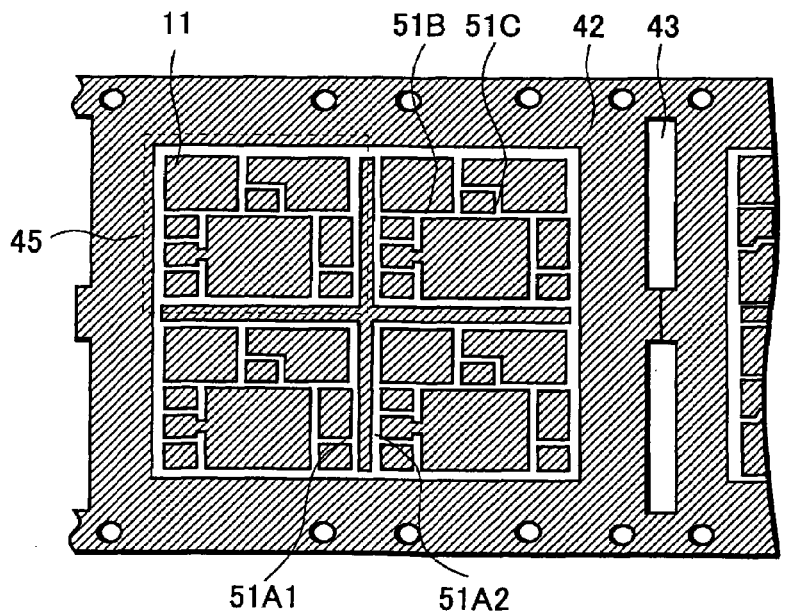

Details of the conductive patterns 11 formed in the above-described step will be described with reference to FIGS. 4A to 4C. FIG. 4A is a cross-sectional view of the conductive foil 40, FIG. 4B is an enlarged plan view of a surface of one of the blocks 42, and FIG. 4C is an enlarged plan view of a rear surface of one of the blocks 42. The conductive foil 40 shown in the drawings is a sheet-like board member which has its own value. Specifically, the conductive foil 40 is processed into this state in a facility having etching equipment. Then, the rest of processes described below will be performed after transporting this conductive foil 40 to another facility. In this way, it is possible to embody the method of manufacturing a circuit device of the present invention even in a facility without the etching equipment.

Referring to FIG. 4A, after completion of the etching process, the first resist PR1 and the second resist PR2 are peeled off, and the both main surfaces of the conductive foil 40 are entirely exposed.

Referring to FIG. 4B, unit 45 including the multiple conductive patterns 11 constituting one circuit device is formed inside one block 42. To be more precise, four units 45 are arranged in a two-by-two matrix. In addition, the respective units 45 are separated by the first isolation trenches 41A extending inside the blocks 42 in a lattice-shaped. The number of the units 45 may be increased or decreased depending on the sizes of the units and the like. Inside one unit 45, the respective conductive patterns 11 are separated into convex shapes by use of the first isolation trenches 41B and 41C.

In addition, to perform positioning in the subsequent dicing process, alignment marks 47 are formed in positions located at boundaries of the respective units 45. These alignment marks 47 protrude in convex shapes as similar to the other conductive patterns 11 owing to formation of the isolation trenches 41. Moreover, the alignment marks 47 protrude out of a rear surface of resin for sealing and are used as visual identification points for positioning in the subsequent etching process on the rear surface.

Referring to FIG. 4C, the second isolation trenches 51 having the smaller widths than the above-described first isolation trenches, and the like are formed on the rear surface of the conductive foil 40. To be more precise, the second isolation trenches 51A1 and 51A2 extend in a lattice-shaped in spaces between the respective units 45. Positions of the second isolation trenches 51A1 and 51A2 in terms of the plane correspond to the positions of the above-described first isolation trench 41A. Meanwhile, inside the unit 45, the second isolation trenches 51B and 51C are formed in positions corresponding to the above-described first isolation trenches 41B and 41C.

Figure 5A:
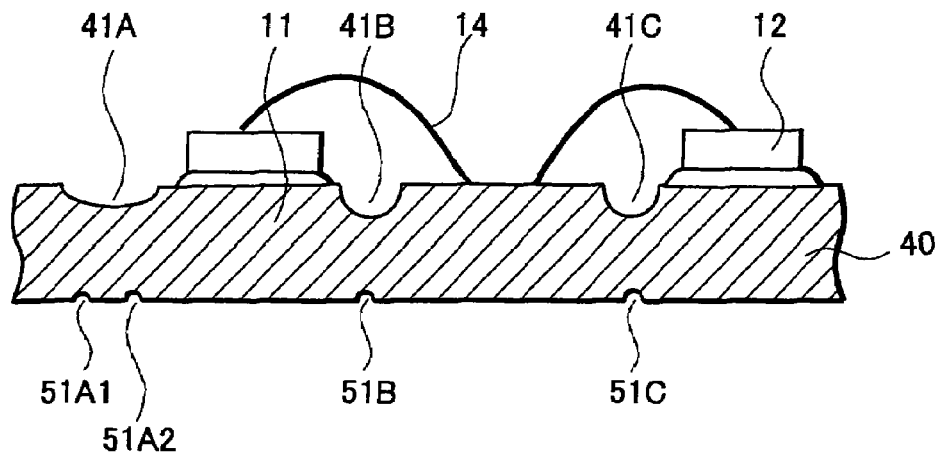
FIG. 5A is a cross-sectional view and FIG. 5B is a plan view showing the method of manufacturing a circuit device according to the embodiment of the present invention.
Figure 5B:
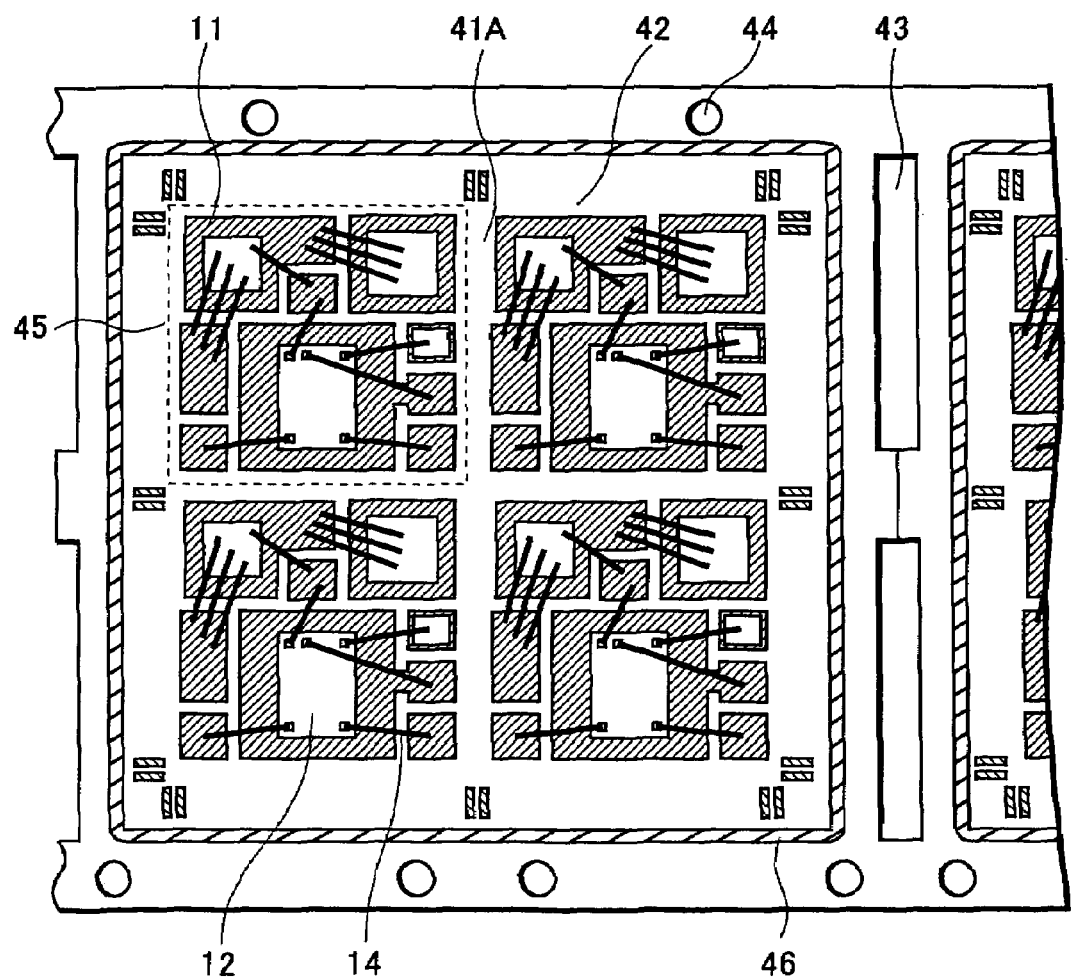

As shown in a cross-sectional view of FIG. 5A and a plan view of FIG. 5B, a second step in this embodiment is to fix circuit elements 12 to the desired conductive patterns 11 in the respective units 45, and to form a connector electrically connecting electrodes of the circuit elements 12 in the respective units 45 to the desired conductive patterns 11.

The circuit element 12 may be a semiconductor element such as a transistor, a diode or an IC chip, or a passive element such as a chip capacitor or a chip resistor. Meanwhile, it is also possible to mount a CSP, a BGA, and the like, although such an element causes an increase in thickness. Moreover, metal thin wires 14 for electrically connecting the circuit elements 12 to the conductive patterns 11 are formed in this step.

Figure 6:
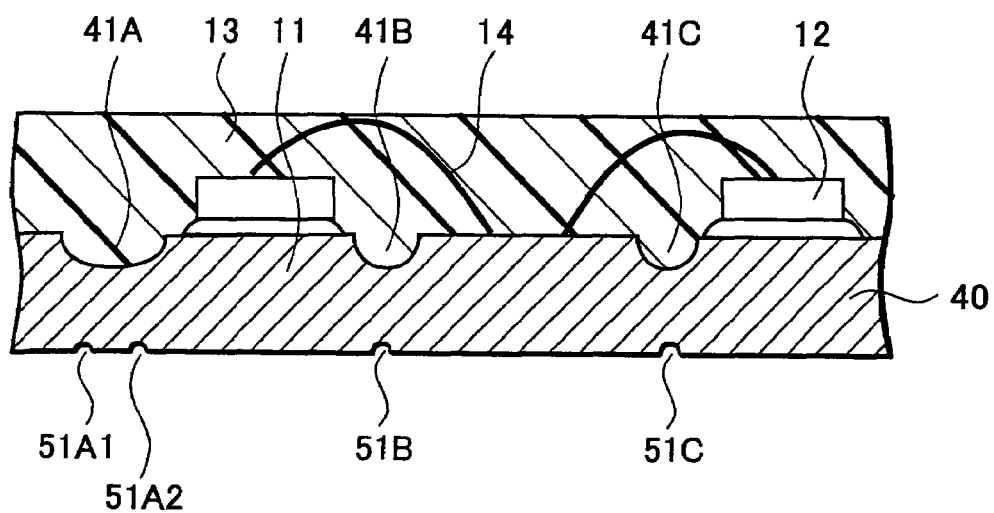
FIG. 6 is a cross-sectional view showing the method of manufacturing a circuit device according to the embodiment of the present invention.

As shown in FIG. 6, a third step in this embodiment is to cover the circuit elements 12 of the respective units 45 in a lump with sealing resin 13 and to fill the sealing resin 13 into the isolation trenches 41.

In this step, the sealing resin 13 covers the circuit elements 12 and the multiple conductive patterns 11. Moreover, the sealing resin 13 is filled in the isolation trenches 41 between the conductive patterns 11 and is engaged with and tightly joined to the curved structures on side surfaces of the conductive patterns 11. Accordingly, the conductive patterns 11 are supported by the sealing resin 13. This step can be realized by transfer molding, injection molding or dipping. As for the material of the sealing resin, thermosetting resin such as epoxy resin is applicable to transfer molding, while thermoplastic resin such as polyimide resin or polyphenylene sulfide is applicable to injection molding.

As shown in FIG. 7A to FIG. 8B, a fourth step in this embodiment is to electrically isolate the respective conductive patterns 11. To be more precise, the conductive foil 40 is removed from the rear surface until the sealing resin 13 filled in the first isolation trenches 41A, 41B, and 41C are exposed. In this embodiment, removal of the conductive foil 40 is performed by wet etching. There are two conceivable methods of removing the rear surface of the conductive foil 40. The first method is to perform etching after selectively covering the rear surface of the conductive foil 40 using resist as an etching mask. The second method is to etch the rear surface of the conductive foil 40 without using an etching mask.

Figure 7A:
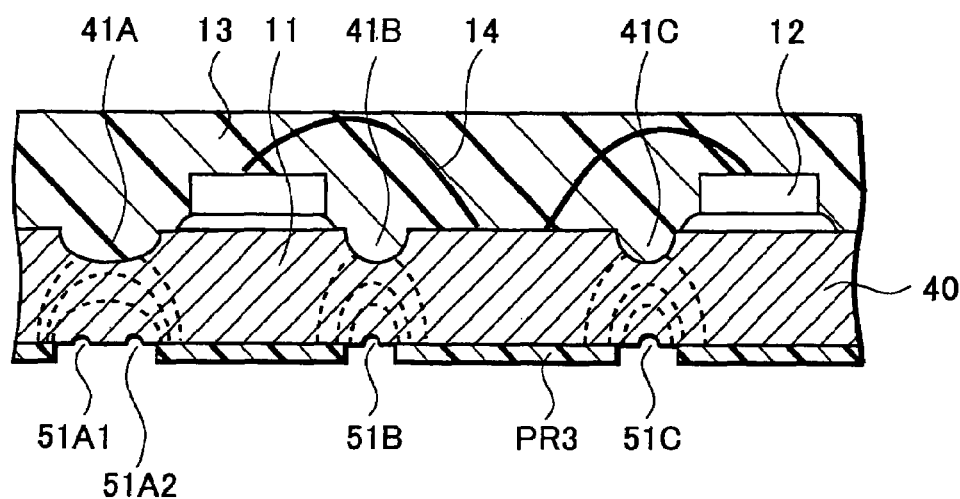
FIGS. 7A and 7B are cross-sectional views showing the method of manufacturing a circuit device according to the embodiment of the present invention.
Figure 7B:
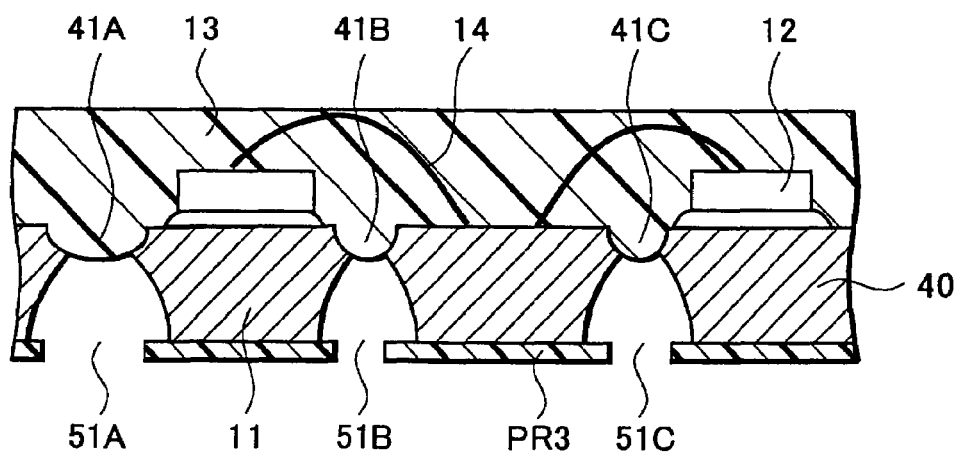

The above-mentioned first method will be described in detail with reference to FIGS. 7A and 7B. FIG. 7A is a cross-sectional view showing the conductive foil 40 in the state before etching, and FIG. 7B is a cross-sectional view showing the conductive foil 40 in the state after etching in accordance with this method.

Referring to FIG. 7A, resist PR3 is selectively formed on the rear surface of the conductive foil 40. The resist PR3 is provided with open portions, and the rear surface of the conductive foil 40 in the positions corresponding to the second isolation trenches 51A1 to 51C and the peripheries thereof is exposed out of the respective open portions. That is, the widths of the open portions provided on the resist PR3 are formed wider than the second isolation trenches.

Moreover, in terms of the second isolation trenches 51A1 and 51A2, both of the isolation trenches are exposed out of one open portion provided on the resist PR3. In this way, the single second isolation trench 51A is integrally formed by etching in this step. However, it is also possible to expose the respective isolation trenches individually out of the resist PR3.

The conductive foil 40 is subjected to etching by use of the resist PR3 formed as described above as the etching mask. In the drawing, behaviors of the progress of etching are indicated with dashed lines. The second isolation trenches 51A1 to 51C are formed on the rear surface of the conductive foil in the positions exposed out of the resist PR3. Therefore, the etching process in this step progresses preferentially in the thickness direction of the conductive foil 40.

To be more precise, the sealing resin 13 filled in the first isolation trenches 41A to 41C is exposed in the convex shapes by the etching process which progresses from the rear surface of the conductive foil 40. By performing the etching process to the degree as shown in the drawing, it is possible to ensure electrical isolation of the respective conductive patterns 11.

Referring to FIG. 7B, the rear surface of the conductive foil 40 is etched until the sealing resin 13 filled in the first isolation trenches 41A to 41C is exposed. In this step, it is possible to perform etching while reducing amounts of side etching by providing the second isolation trenches 51A1 to 51C on the rear surface of the conductive foil 40. Accordingly, it is possible to ensure electrical isolation of the respective conductive patterns 11 in the positions where the isolation trenches are formed. Moreover, as the amounts of side etching are reduced, it is possible to increase areas of the rear surfaces of the conductive patterns 11. Furthermore, it is possible to form larger external electrodes which are formed in contact with the rear surfaces of the conductive patterns 11. In addition, the conductive patterns 11 mutually isolated in this step can be formed thicker than those in the conventional example. To be more precise, it is possible to form the conductive patterns 11 with the thickness approximately equal to or above 100 μm.

Figure 8A:
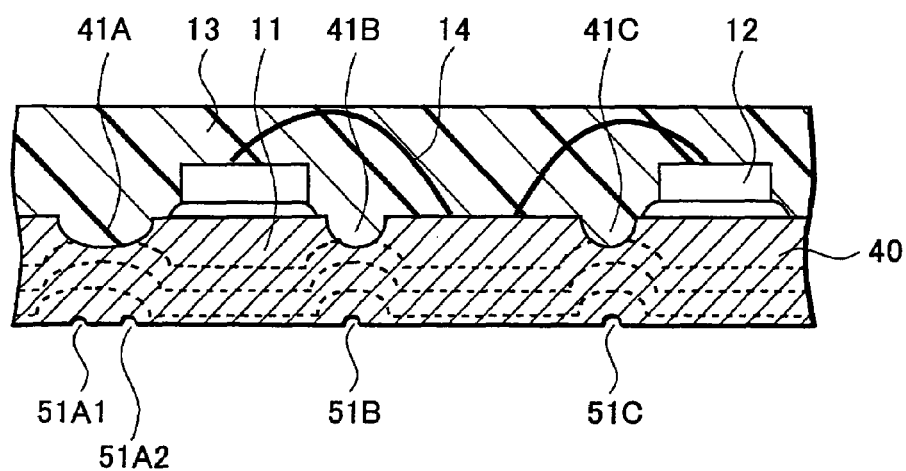
FIGS. 8A and 8B are cross-sectional views showing the method of manufacturing a circuit device according to the embodiment of the present invention.

Next, the second method of electrically isolating the respective conductive patterns 11 by removing the conductive foil 40 from the rear surface without the etching mask will be described with reference to FIGS. 8A and 8B. FIG. 8A is a cross-sectional view showing the conductive foil 40 in the state before etching, and FIG. 8B is a cross-sectional view showing the conductive foil 40 in the state after etching in accordance with this method.

Referring to FIG. 8A, the second isolation trenches 51A1 to 51C are formed in advance on the rear surface of the conductive foil 40 in the above-described steps. Therefore, even when the rear surface of the conductive foil 40 is etched without using a mask, the etching process progresses preferentially from the regions where these second isolation trenches are formed. In the drawing, behaviors of the progress of etching are indicated with dashed lines. From the behaviors indicated with the dashed lines, it is apparent that amounts of progresses of etching in the regions corresponding to bottoms of the first isolation trenches 41A to 41C are larger than other regions. Here, the etching process is also performed until the sealing resin 13 filled in the first isolation trenches 41A to 41C is exposed in convex shapes.

Figure 8B:
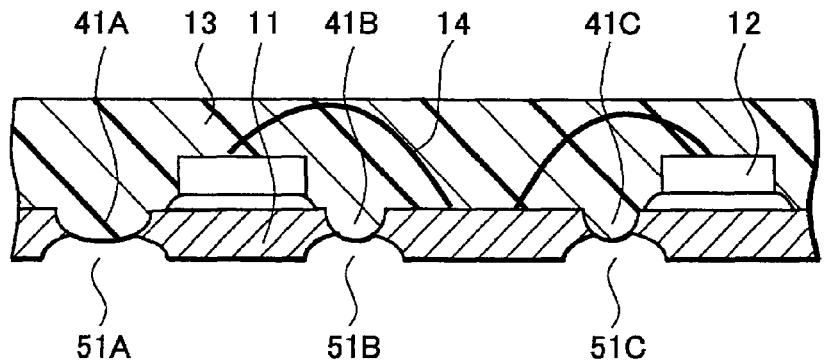

Referring to FIG. 8B, the rear surface of the conductive foil 40 is etched until the sealing resin 13 filled in the first isolation trenches 41A to 41C is exposed. As described previously, the etching process preferentially progresses from the regions where the second isolation trenches 51 are provided. Accordingly, the rear surfaces of the conductive patterns 11 protrude out of the sealing resin exposed out of the first isolation trenches 41. In this way, the second etching method can also exert the effect similar to the above-described first method. Moreover, it is possible to form wider plane surfaces on the rear surfaces of the conductive patterns 11 as compared to the conventional example.

After completion of the above-described step, the rear surfaces of the respective units 45 are covered with resist 16, and then external electrodes 15 are formed on the rear surfaces of the conductive patterns 11 exposed out of the resist 16. In this way, the cross-sectional formation as shown in FIG. 1B is obtained.

Figure 9:
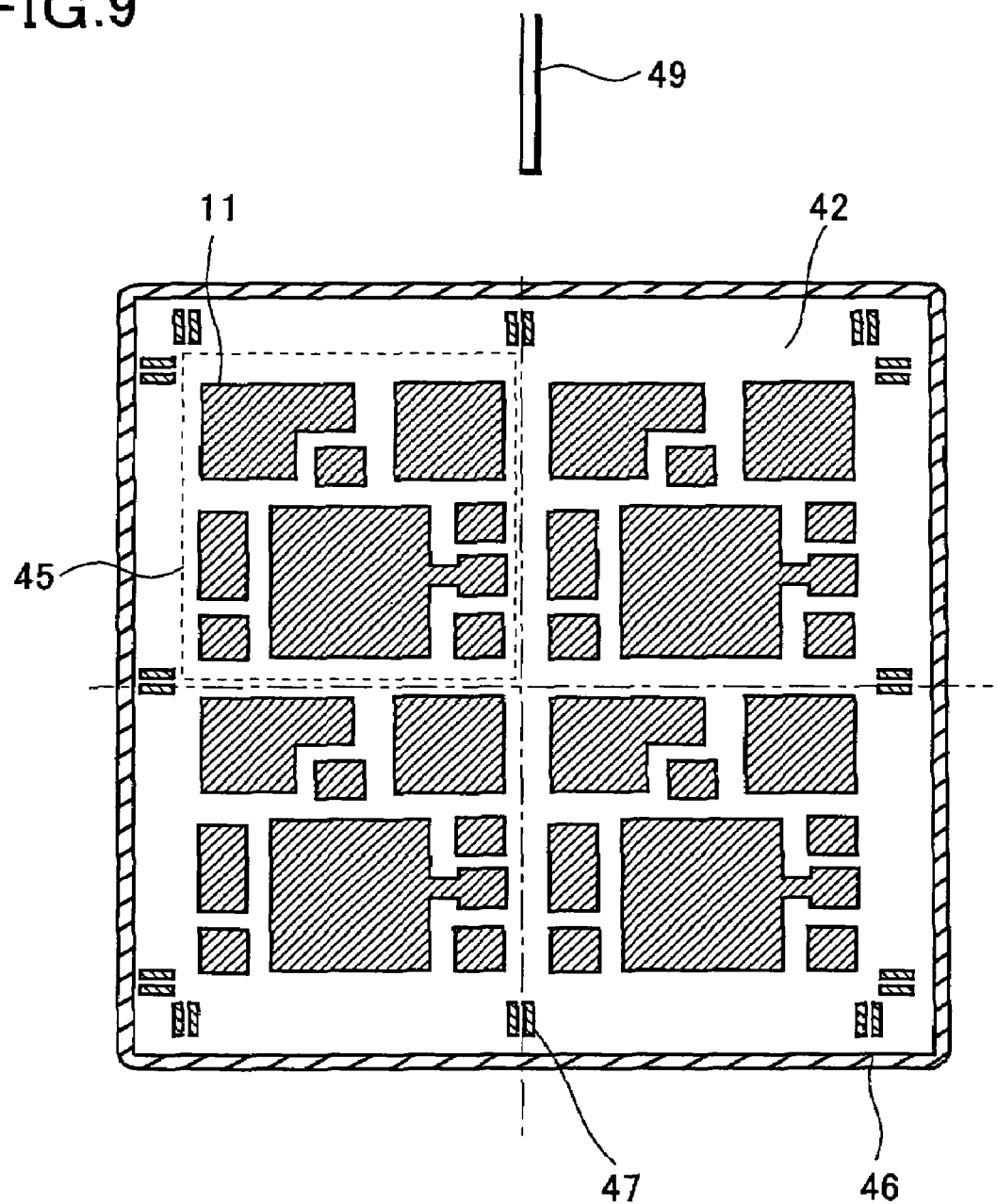
FIG. 9 is a plan view showing the method of manufacturing a circuit device according to the embodiment of the present invention.

A fifth step in this embodiment is to divide the sealing resin 13 into the respective units 45 by dicing, as shown in FIG. 9.

In this step, the sealing resin 13 in the isolation trenches 41 is diced along dicing lines between the respective units 45 with dicing blade 49, thereby dividing the units into individual circuit devices. In this step, only the sealing resin 13 filled in the isolation trench 41 exists in each dicing line. Accordingly, it is possible to reduce abrasion of the dicing blade 49, to suppress metal burrs, and to dice the circuit devices into highly accurate contours. To be more precise, the dicing process is performed along a middle portion of the second isolation trench 51A (see FIG. 8B) formed between the respective units 45. Moreover, division in this step is performed after visually identifying the alignment marks 47 formed in the previous step.

Third Embodiment

In this embodiment, a method of manufacturing a circuit device according to another embodiment will be described with reference to FIG. 10A to FIG. 11B. The method of manufacturing a circuit device of this embodiment is basically similar to the above-described second embodiment. This embodiment is different from the second embodiment in that covering resin 61 for covering conductive patterns 11 and first isolation trenches 41 is formed herein. The method of manufacturing a circuit device of this embodiment will now be described below mainly in terms of this difference.

Figure 10A:
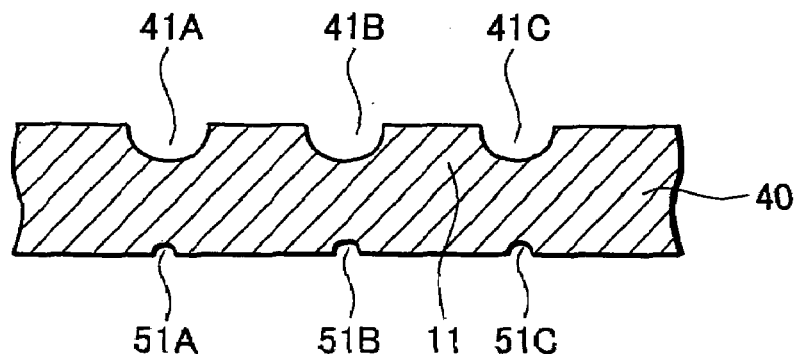
FIGS. 10A to 10C are cross-sectional views showing another method of manufacturing a circuit device according to the embodiment of the present invention.

Referring to FIG. 10A, conductive foil 40 having the first isolation trenches 41 formed on a surface and second isolation trenches 51 formed on a rear surface is prepared. Here, three first isolation trenches 41A to 41C are formed on the surface, and the second isolation trenches 51 are formed on the rear surface of the conductive foil 40 in positions corresponding to these first insulation trenches 41. The method of forming these isolation trenches is similar to the above-described second embodiment.

Figure 10B:
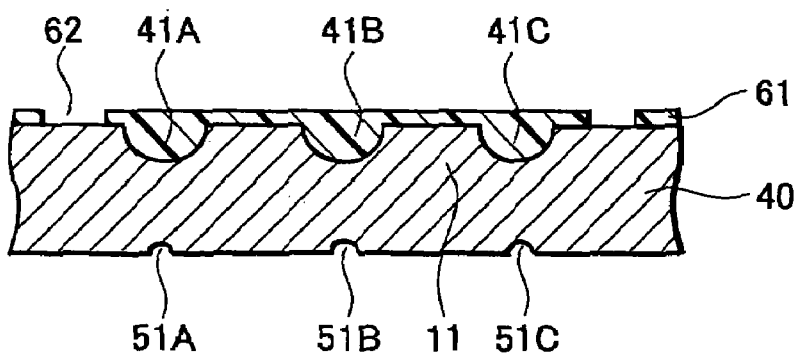

Referring to FIG. 10B, the covering resin 61 is formed to cover the surface of the conductive foil 40 inclusive of the first isolation trenches 41. There are two conceivable methods of forming the covering resin 61, namely, a method of coating semisolid resin on the surface of the conductive foil 40, and a method of laminating a resin film of a sheet shape on the surface of the conductive foil 40. In addition, open portions 62 are formed so as to expose the surface of the conductive foil 40 in regions constituting electrically connecting regions.

Figure 10C:
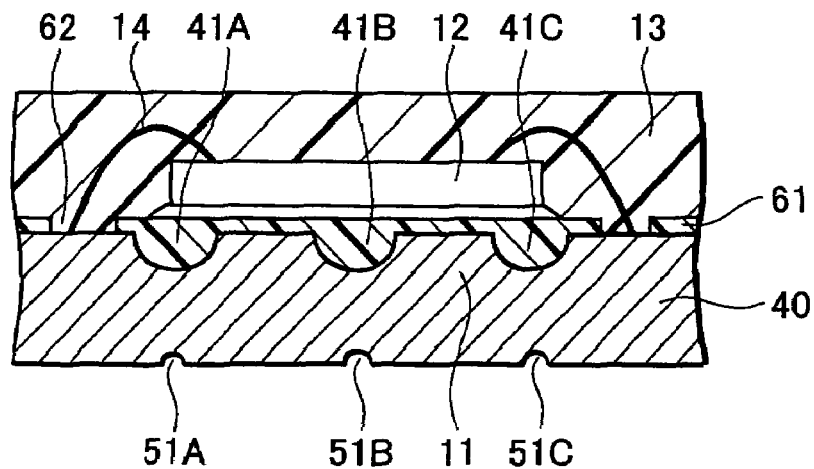

Referring to FIG. 10C, circuit element 12 is fixed onto a surface of the covering resin 61 formed in the precedent step by use of an adhesive. Here, one circuit element 12, which is an LSI, is fixed. However, it is also possible to fix multiple circuit elements of different types. The regions on the surface of the conductive foil 40 exposed out of the covering resin 61 are electrically connected to the circuit element 12 through metal thin wires 14. Moreover, sealing resin 13 is formed so as to cover the circuit element 12 and the metal thin wires 14.

Figure 11A:
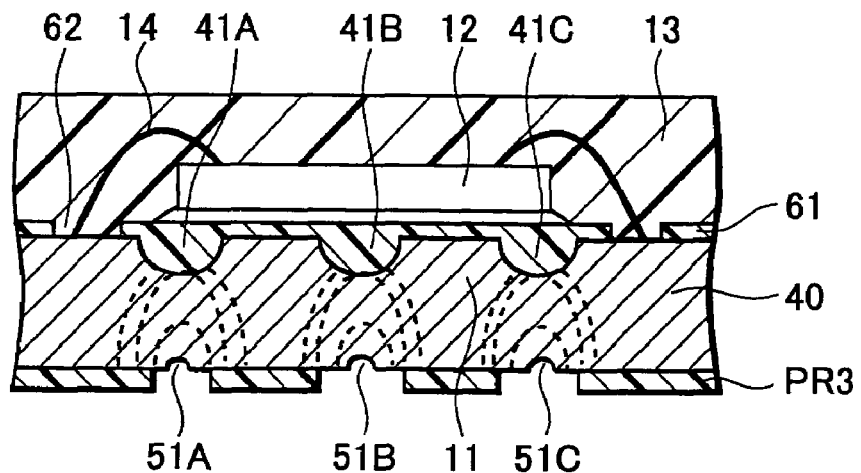
FIGS. 11A and 11B are cross-sectional views showing the other method of manufacturing a circuit device according to the embodiment of the present invention.
Figure 11B:
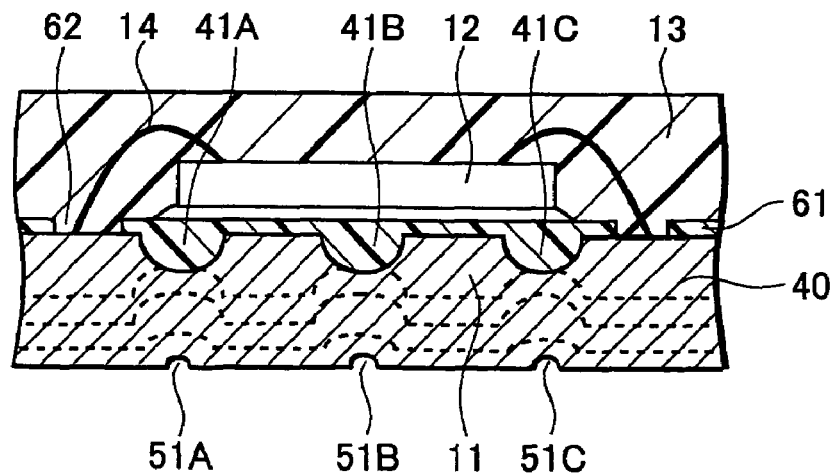
Figure 12:
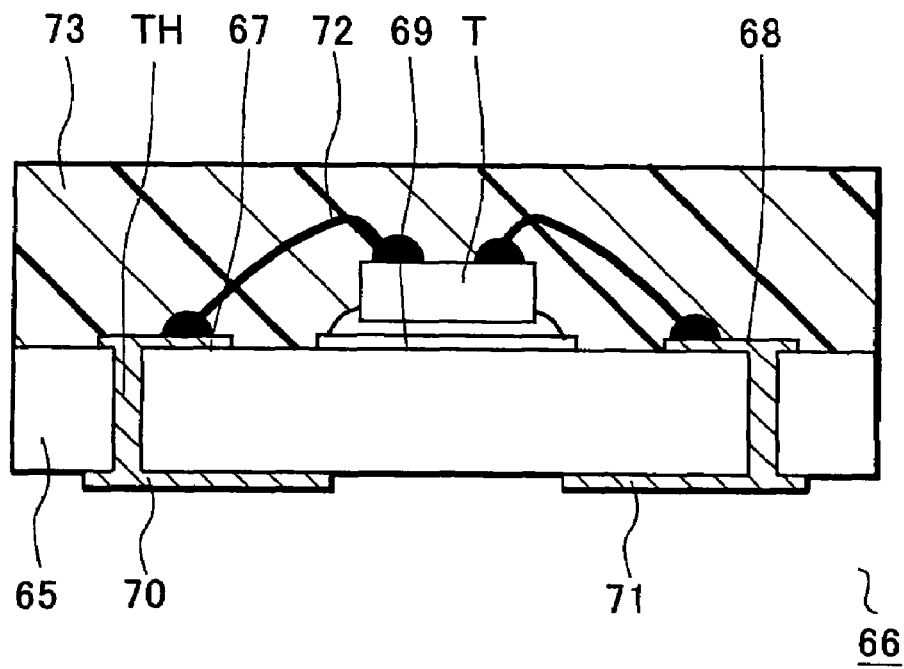
FIG. 12 is a cross-sectional view showing a conventional circuit device.

Subsequently, as shown in FIGS. 11A and 11B, the covering resin 61 filled in the first isolation trenches 41 is exposed by removing the conductive foil 40 from the rear surface, and the respective conductive patterns 11 are electrically isolated.

In FIG. 11A, the conductive foil 40 is etched by selectively forming resist PR3 on the rear surface of the conductive foil 40. Meanwhile, in FIG. 11B, the respective conductive patterns 11 are isolated by etching without a mask. Here, the conductive foil 40 is also etched until the covering resin 61 filled in the first isolation trenches 41A to 41C is exposed in convex shapes. Other steps are similar to those described in the second embodiment.

According to this step, electrodes are provided below the circuit element 12. Moreover, as similar to the circuit devices shown in FIG. 1A to FIG. 2, it is also possible to incorporate wiring portion 11C extending below the metal thin wires 14 into the circuit device manufactured in accordance with the manufacturing method of this embodiment. In addition, in this embodiment, the covering resin 61 which is filled in the isolation trenches 41 is exposed out of the rear surface.

What is claimed is:

1. A sheet-like board member comprising:
a conductive foil,
a protruding conductive pattern defined by a partially etched first isolation trench, the conductive pattern being formed on a first main surface of the conductive foil,
a second isolation trench formed on a second main surface of the conductive foil in a region corresponding to the first isolation trench; wherein the second isolation trench is located beneath the first isolation trench and has a depth that is less than a depth of the first isolation trench; and
wherein the combined depths of the first isolation trench and the second isolation trench are less than a thickness of the conductive foil.

2. The sheet-like board member according to claim 1, wherein a unit constituting a circuit device is defined by multiple conductive patterns, and multiple units are arranged in a matrix on the first main surface.

3. The sheet-like board member according to claim 2, wherein a block formed of the multiple units is formed on the first main surface, and an alignment mark defined by the first isolation trenches is formed inside the block.

4. The sheet-like board member according to claim 1, wherein the second isolation trench is shallower than the first isolation trench.

5. The sheet-like board member according to claim 1, wherein the first isolation trenches are formed substantially in the same width.

6. The sheet-like board member according to claim 1, wherein the first isolation trench adjacent to the conductive pattern configured to fix a power system element thereto is formed wider than the rest of the first isolation trenches.

* * * * *